United States Patent
Choi et al.

(10) Patent No.: US 8,717,814 B2
(45) Date of Patent: May 6, 2014

(54) 3-D NONVOLATILE MEMORY DEVICE AND METHOD OF MANUFACTURING THE SAME, AND MEMORY SYSTEM INCLUDING THE 3-D NONVOLATILE MEMORY DEVICE

(75) Inventors: Sang Moo Choi, Gyeonggi-do (KR); In Hey Lee, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/599,616

(22) Filed: Aug. 30, 2012

(65) Prior Publication Data

US 2013/0100741 A1    Apr. 25, 2013

(30) Foreign Application Priority Data

Oct. 24, 2011  (KR) .......................... 10-2011-0108912

(51) Int. Cl.
*G11C 5/02*  (2006.01)
*G11C 5/06*  (2006.01)

(52) U.S. Cl.
CPC .. *G11C 5/02* (2013.01); *G11C 5/06* (2013.01); *G11C 2213/71* (2013.01)
USPC ............................ 365/185.05; 365/51; 365/63

(58) Field of Classification Search
CPC .......... G11C 221/71; G11C 5/02; G11C 5/06; G11C 2213/753
USPC ............................ 365/185.05, 185.17, 51, 63
See application file for complete search history.

(56) References Cited

U.S. PATENT DOCUMENTS

2013/0301350 A1 *  11/2013  Choe et al. .................... 365/184

* cited by examiner

*Primary Examiner* — Ly D Pham
(74) *Attorney, Agent, or Firm* — IP & T Group LLP

(57) ABSTRACT

A three-dimensional (3-D) nonvolatile memory device includes vertical channel layers protruded from a substrate, interlayer insulating layers and memory cells, which are alternately stacked along the vertical channel layers, and select transistors including planar channel layers, each contacted with at least one of the vertical channel layers and being parallel to the substrate, and gate insulating layers formed over the planar channel layers.

12 Claims, 14 Drawing Sheets

3-D NONVOLATILE MEMORY DEVICE AND METHOD OF MANUFACTURING THE SAME, AND MEMORY SYSTEM INCLUDING THE 3-D NONVOLATILE MEMORY DEVICE

CROSS-REFERENCE TO RELATED APPLICATION

Priority to Korean patent application number 10-2011-01.08912 filed on Oct. 24, 2011, the entire disclosure of which is incorporated by reference herein, is claimed.

BACKGROUND

Embodiments of this disclosure relate to a nonvolatile memory device and, more particularly, to a three-dimensional (3-D) nonvolatile memory device and a method of manufacturing the same, and a memory system including the 3-D nonvolatile memory device.

In order to increase the degree of memory devices, a 3-D structured memory device in which memory cells are arranged in a 3-D has been proposed. The 3-D structured memory device can efficiently utilize the area of a substrate and improve the degree of integration as compared with the case where memory cells are arranged in a two-dimensional. In particular, it has been suggested that the regular arrangement of the memory cells of a NAND flash memory device, which is advantageous to the high degree of integration as one of nonvolatile memory devices, is applied into a 3-D structure.

A 3-D memory device includes strings having memory cells stacked over a substrate and select transistors. The channel of the string is formed along vertical channel layer protruded upwardly from the substrate. The gates of the memory cells are formed to surround the vertical channel layer. An interlayer insulating layer is formed between the gates of memory cells in adjacent layers. The gate of the select transistor is formed to surround the vertical channel layer. The gate of the select transistor is spaced apart from the gates of the memory cells with the interlayer insulating layer interposed between the select transistor and the memory cells.

The vertical channel layer may be formed within a vertical hole that penetrates the interlayer insulating layers and conductive layers. The interlayer insulating layers and the conductive layers are alternately stacked. The conductive layers are used as the gates of the memory cells and the gate of the select transistor. Before forming the vertical channel layer, a multi-layered layer including a charge blocking layer, a charge trap layer and a tunnel insulating layer, which are sequentially stacked, is formed on the sidewall of the vertical hole. In this case, when the select transistor is operated, charges are trapped in the charge trap layer of the select transistor because the charge trap layer is formed between the gate of the select transistor and the vertical channel layer. As a result, the threshold voltage of the select transistor may shift. In particular, in the 3-D memory device, an erase operation is performed using Gate Induced Drain Leakage (GIDL) current induced by generating holes on the select gate side. If voltage supplied to the select gate is raised in order to increase the erase speed of this 3-D memory device, the threshold voltage of the select transistor further greatly shifts because the amount of charges trapped in the charge trap layer of the select transistor increases.

Meanwhile, the vertical channel layer may have a stack structure of a first vertical channel layer and a second vertical channel layer. The first vertical channel layer is formed within a first vertical hole that penetrates the interlayer insulating layers and the conductive layers used as the gates of the memory cells. The interlayer insulating layers and the conductive layers are alternately stacked. Before forming the first vertical channel layer, a multi-layered layer including a charge blocking layer, a charge trap layer and a tunnel insulating layer, which are sequentially stacked, is formed on the sidewall of the first vertical hole. The second vertical channel layer is formed within a second vertical hole through which the top surface of the first vertical channel layer is exposed. The second vertical hole is formed to penetrate a conductive layer for a select gate additionally deposited after forming the first vertical channel layer. Before forming the second vertical channel layer, a gate insulating layer is formed on the sidewall of the second vertical hole. In this case, a shift in the threshold voltage of the select transistor when the select transistor is operated may be improved because the charge trap layer is not formed between the gate of the select transistor and the second vertical channel layer.

In the process of forming the gate insulating layer on the sidewall of the second vertical hole, an insulating layer is deposited on the entire structure including the second vertical hole. The insulating layer is partially etched to expose the top surface of the first vertical channel layer. Here, a problem may arise because the first vertical channel layer is damaged by the etch process of the insulating layer.

Meanwhile, in the process of forming the second vertical channel layer within the second vertical hole, a semiconductor layer is deposited on the entire structure including a gate insulating layer. The semiconductor layer out of the second vertical hole is removed. Here, a concern arises because the gate insulating layer of the select transistor may be damaged by the etch process of the semiconductor layer.

As described above, in the known 3-D memory device, it may be difficult to secure operation reliability because of the concern related to shifting of threshold voltage of the select transistor or the concern related to damage in the gate insulating layer and the channel of the select transistor.

BRIEF SUMMARY

An exemplary embodiment of this disclosure relates to a 3-D nonvolatile memory device having improved reliability, a method of manufacturing the same, and a memory system including the 3-D nonvolatile memory device.

In an aspect, a 3-D nonvolatile memory device includes a plurality of vertical channel layers protruded from a substrate; a plurality of interlayer insulating layers and a plurality of memory cells, which are alternately stacked along the plurality of vertical channel layers; and a plurality of select transistors including a plurality of planar channel layers, each contacted with at least one of the vertical channel layers and being parallel to the substrate, and gate insulating layers formed over the plurality of planar channel layers.

In an aspect, a memory system includes the above-described 3-D nonvolatile memory device and a memory controller configured to control the 3-D nonvolatile memory device.

In an aspect, a method of manufacturing a 3-D nonvolatile memory device includes forming a plurality of memory cells along a plurality of vertical channel layers protruded from a substrate; stacking a planar channel layer, a gate insulating layer, and a select gate layer over the entire structure in which the plurality of vertical channel layers and the plurality of memory cells are formed; forming select lines by patterning the select gate layer; and forming junctions by implanting an impurity into the planar channel layers on both sides of each of the select lines.

DESCRIPTION OF EMBODIMENTS

Hereinafter, some exemplary embodiments of the present disclosure will be described in detail with reference to the accompanying drawings. The figures are provided to allow those having ordinary skill in the art to understand the scope of the embodiments of the disclosure.

Figure 1:
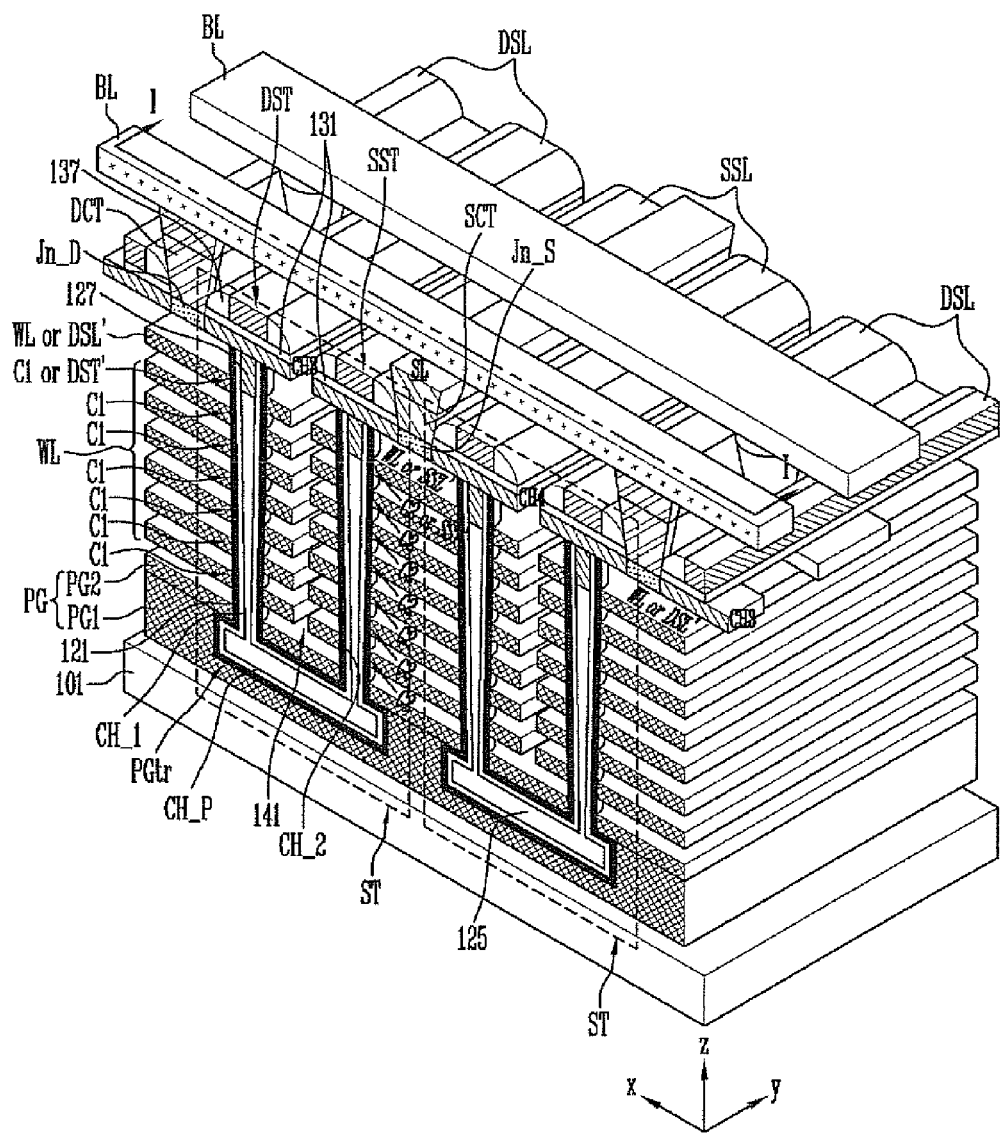
FIG. 1 is a perspective view of a 3-D nonvolatile memory device according to a first embodiment of this disclosure.

FIG. 1 is a perspective view of a 3-D nonvolatile memory device according to a first embodiment of this disclosure. In FIG. 1, interlayer insulating layers and gap-fill insulating layers formed within slits 141 are not shown, for simplicity.

Referring to FIG. 1, the 3-D nonvolatile memory device according to the first embodiment include bit lines BL, a source line SL formed to cross the bit lines BL and isolated from the bit lines BL, and a memory string ST coupled between the source line SL and the bit line BL. Some memory strings ST arranged in a direction where the bit lines BL are extended are coupled in parallel to the respective bit lines BL. Some memory strings ST arranged in a direction where the source line SL is extended are coupled to the source line SL in common.

The bit lines BL are conductive patterns isolated from a substrate 101 and disposed over the substrate 101. The bit lines BL are isolated from each other and disposed in parallel. For example, the bit lines BL may be extended in the X direction of an XYZ coordinate system.

The source line SL isolated from the bit line BL and the substrate 101 is a conductive pattern disposed between the bit line BL and the substrate 101. The source line SL is extended in a direction to cross the bit lines BL and may be extended, for example, in the Y direction.

Each of the memory strings ST includes a pipe connection transistor PGtr, a pair of memory cell groups C1 and C2 coupled to both ends of the pipe connection transistor PGtr, and select transistors DST and SST coupled to the respective memory cell groups C1 and C2.

The pipe connection transistor PGtr is formed at the intersection of a pipe gate PG and a pipe channel layer CH_P. The pipe gate PG includes a first pipe gate PG1 isolated from the substrate 101 and formed over the substrate 101. Meanwhile, although not shown in the drawing, the first pipe gate PG1 may be formed of the substrate 101. Trenches are formed within the first pipe gate PG1. The pipe channel layer CH_P is formed on the inner walls of the trenches. The pipe gate PG may further include a second pipe gate PG2 contacted with the first pipe gate PG1 and disposed over the first pipe gate PG1. After further forming the second pipe gate PG2, the pipe channel layer CH_P is further formed on the rear of the second pipe gate PG2 over the trenches and is extended to penetrate the second pipe gate PG2 over both ends of the trench. The second pipe gate PG2 functions to extend a region where an electric field is formed within the pipe channel layer CH_P, thus improving a cell current that flows through the channels of the memory strings ST. The outer wall surface of the pipe channel layer CH_P is surrounded by the pipe gate PG with a multi-layered layer 121 interposed between the pipe channel layer CH_P and the pipe gate PG. The multi-layered layer 121 includes insulating layers. The multi-layered layer 121 may also include a charge trap layer extended from the memory cells C1 and C2.

The pair of memory cell group includes multi-layered memory cells C1 and C2 stacked between the substrate 101 and the bit line BL, or between the substrate 101 and the source line SL. The memory cells C1 and C2 are formed at the intersection of word lines WL and vertical channel layers CH_1 and CH_2 which are coupled to the pipe channel layer CH_P. The memory cells C1 and C2 are isolated from the pipe gate PG and stacked over the pipe gate PG. The vertical channel layers CH_1 and CH_2 are upwardly protruded toward the bit lines BL from the substrate 101. The memory cells C1 and C2 are stacked along the vertical channel layers CH_1 and CH_2. The pair of vertical channel layers CH_1 and CH_2 is coupled to each of the pipe channel layers CH_P of the memory strings ST. The pair of vertical channel layers CH_1 and CH_2 is contacted with planar channel layers CH_3 and CH_4 which are formed over the vertical channel layers CH_1 and CH_2 in parallel to the substrate 101. Hereinafter, one of the pair of vertical channel layers CH_1 and CH_2 coupled to the pipe channel layer CH_P is called a first vertical channel layer CH_1, and the other thereof is called a second vertical channel layer CH_2, for convenience of description.

Word lines WL, coupled to the memory cells C1 staked along the first vertical channel layer CH_1, and other word lines WL, coupled to the memory cells C2 stacked along the second vertical channel layer CH_2, are separated from each other by the slit 141 formed between the first and the second vertical channel layers CH_1 and CH_2. Furthermore, the word lines WL are extended in a direction to cross the bit lines BL. For example, the word lines WL may be extended in the Y direction. The slit 141 is extended in a direction where the word lines WL are extended. Furthermore, the word lines WL surround the first or second vertical channel layer CH_1 or CH_2 with the multi-layered layer 121 interposed therebetween. The number of stacked word lines WL may vary depending on the number of memory cells to be stacked.

Each of the first and the second vertical channel layers CH_1 and CH_2 may have an empty tube form. In this case, a gap-fill insulating layer 125 may be filled within the first and the second vertical channel layers CH_1 and CH_2 having a form of the tube. Furthermore, the upper portions of the tube form may be filled with a doped polysilicon layer 127 in order to improve resistance of the channels. The multi-layered layer 121 may have a stack structure of a charge blocking layer, a charge trap layer, and a tunnel insulating layer.

The select transistors DST and SST include the first select transistor DST, including a first planar channel layer CH_3 coupled to the first vertical channel layer CH_1, and a second select transistor SST including a second planar channel layer CH_4 coupled to the second vertical channel layer CH_2.

The first select transistor DST includes the first planar channel layer CH_3, a gate insulating layer 131 formed over the first planar channel layer CH_3, and a first select line DSL formed over the gate insulating layer 131 and configured to become a select gate. The first select line DSL may be extended in a direction to cross the bit lines BL, e.g., the Y direction. Furthermore, the first select line DSL is disposed so that it overlaps with the first vertical channel layer CH_1. The first planar channel layers CH_3 are separated from each other in the direction where the word lines WL are extended.

The second select transistor SST includes the second planar channel layer CH_4, the gate insulating layer 131 formed over the second planar channel layer CH_4, and a second select line SSL formed over the gate insulating layer 131 and configured to become a select gate. The second select line SSL may be extended in the direction to cross the bit lines BL, e.g., the Y direction. Furthermore, the second select line SSL is disposed so that it overlaps with the second vertical channel layer CH_2. The second planar channel layers CH_4 are separated from each other in the direction where the word lines WL are extended.

The slit 141 is extended in the Z direction and configured to separate the first and the second planar channel layers CH_1 and CH_2 from each other. Furthermore, a spacer 137 may be formed on the sidewalls of the first and the second select lines DSL and SSL. The spacer 137 may be made of material having an etch selectivity against the interlayer insulating layers, in order to protect the sidewalls of the first and the second select lines DSL and SSL during a process of etching the interlayer insulating layers in order to form the slits 141.

The first planar channel layer CH_3 is extended so that it can be coupled to the first vertical channel layers CH_1 which are adjacent to each other. Likewise, the second planar channel layer CH_4 is extended so that it can be coupled to the second vertical channel layers CH_2 which are adjacent to each other. That is, the first planar channel layer CH_3 and the second planar channel layer CH_4 are coupled to different pipe channel layers CH_P respectively, but coupled together to the vertical channel layers CH_1 and CH_2, which are adjacent to each other.

Junctions Jn_D and Jn_S including an implanted impurity are formed within the first and the second planar channel layers CH_3 and CH_4, respectively. The junctions Jn_D and Jn_S include a drain junction Jn_D and a source junction Jn_S. The drain junction Jn_D is formed within the first planar channel layer CH_3 between the first select lines DSL adjacent to each other. The source junction Jn_S is formed within the second planar channel layer CH_4 between the second select lines SSL adjacent to each other.

The first planar channel layers CH_3 may be disposed under the bit lines BL. In order to couple the drain junction Jn_D of the first planar channel layer CH_3 and the bit line BL, a drain contact plug DCT may be formed between the drain junction Jn_D and the bit line BL.

The second planar channel layers CH_4 may be disposed under the source line SL. In order to couple the source junction Jn_S of the second planar channel layer CH_4 to the source line SL, a source contact plug SCT may be formed between the source junction Jn_S and the source line SL.

Each of the memory strings ST may further include a first sub-select transistor DST' formed under the first select transistor DST and a second sub-select transistor SST' formed under the second select transistor SST. Accordingly, the bit line BL is coupled to the memory string ST through the select transistors DST and DST' of the dual structure. The source line SL is also coupled to the memory string ST through the select transistors SST and SST' of the dual structure. In this case, a punch-through phenomenon can be improved by controlling a bias supplied to the gates DSL, DSL', SSL, and SSL' of the select transistors having the dual structures. Here, wires surrounding the first and the second vertical channel layers CH_1 and CH_2 over the memory cell groups C1 and C2 may be sub-select lines DSL' and SSL', i.e., the select gates of the first and the second sub-select transistors DST' and SST'.

In accordance with the first embodiment, the gate insulating layers 131 of the first and the second select transistors DST and SST are separated from the multi-layered layer 121 including the charge trap layer. Thus, a phenomenon in which charges are trapped in the gate insulating layers 131 of the first and the second select transistors DST and SST may be improved. As a result, in accordance with the first embodiment, although an erase operation is performed using a raised Gate Induced Drain Leakage (GIDL) current, a shift in the threshold voltages of the first and the second select transistors DST and SST may be improved.

Furthermore, the first and the second vertical channel layers CH_1 and CH_2 of the memory cells C1 and C2 are surrounded by the gate insulating layers 131 of the first and the second select transistors DST and SST and the planar channel layers CH_3 and CH_4. Accordingly, the vertical channel layers CH_1 and CH_2 of the memory cells C1 and C2 may be prevented from getting damage during an etch process for patterning the gate insulating layers 131 of the first and the second select transistors DST and SST and the planar channel layers CH_3 and CH_4. As a result, deteriorated channel characteristics of the memory cells C1 and C2 may be suppressed.

Furthermore, the planar channel layers CH_3 and CH_4 of the first and the second select transistors DST and SST are formed under the gate insulating layers 131 as described above. Accordingly, the gate insulating layers 131 may be prevented from getting damage in the process of patterning the planar channel layers CH_3 and CH_4 of the first and the second select transistors DST and SST.

A method of manufacturing the 3-D nonvolatile memory device according to the first embodiment is described in detail below.

FIGS. 2A to 2M are cross-sectional views taken along line "I-I" of the perspective view of FIG. 1 in order to describe the method of manufacturing the 3-D nonvolatile memory device.

Figure 2A:
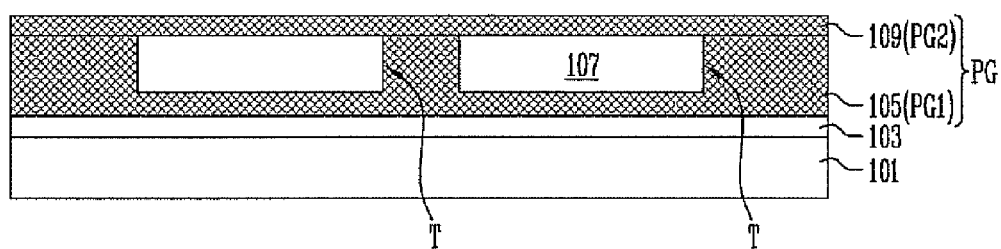
FIGS. 2A to 2M are cross-sectional views taken along line "I-I'" of the perspective view of FIG. 1 in order to describe a method of manufacturing the 3-D nonvolatile memory device.

Referring to FIG. 2A, an interlayer insulating layer 103 is formed over the substrate 101. The pipe gate PG having a sacrificial layer 107 filled therein is formed over the interlayer insulating layer 103.

The interlayer insulating layer 103 is formed to insulating the pipe gates PG from the substrate 101 and may be a silicon oxide ($SiO_2$) layer.

The pipe gate PG includes a first conductive layer 105 for the first pipe gate PG1 and a second conductive layer 109 for the second pipe gate PG2. The first conductive layer 105 is formed over the interlayer insulating layer 103. After forming the first conductive layer 105, the plurality of trenches T, arranged in a matrix form having a plurality of rows and columns, is formed within the first conductive layer 105 by etching the first conductive layer 105. Next, the trenches T are filled with the sacrificial layer 107. The sacrificial layer 107 may be a silicon oxide ($SiO_2$) layer. Next, the second conductive layer 109 is formed over the entire structure in which the sacrificial layer 107 is formed. The first and the second conductive layers 105 and 109 may be polysilicon layers.

Figure 2B:
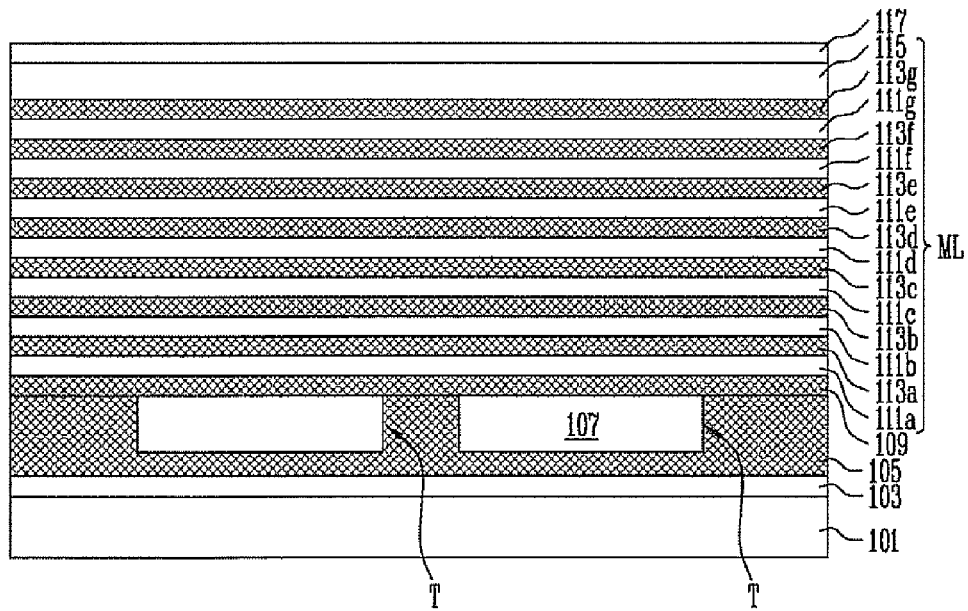

Referring to FIG. 2B, interlayer insulating layers 111a to 111g and 115 and third conductive layers 113a to 113g are alternately formed over the entire structure including the second conductive layer 109, thereby forming stack structures ML. The third conductive layers 113a to 113g are used to form the word lines, i.e., the cell gates. In some embodiments, the remaining third conductive layers 113a to 113f other than the third conductive layer 113g, i.e., the highest layer of the third conductive layers 113a to 113g, may be used to form the word lines, i.e., the cell gates. The third conductive layer 113g, i.e., the highest layer, may be used to form the sub-select line, i.e., a sub-select gate. Here, the interlayer insulating layer 111a may be formed prior to the third conductive layer 113a. The interlayer insulating layer 115 may be formed at the top of the stack structure ML. The interlayer insulating layers 111a to 111g and 115 may be formed of silicon oxide ($SiO_2$) layers. The third conductive layers 113a to 113g may be formed of polysilicon layers. The number of third conductive layers 113a to 113g may be designed in various ways depending on the number of memory cells to be stacked.

A hard mask layer 117 is formed over the stack structures ML. The hard mask layer 117 preferably is made of material having a different etch selectivity against the interlayer insulating layers 111a to 111g and 115 and the third conductive layers 113a to 113g. The hard mask layer 117 may be formed of a silicon nitride (SiN) layer.

Figure 2C:
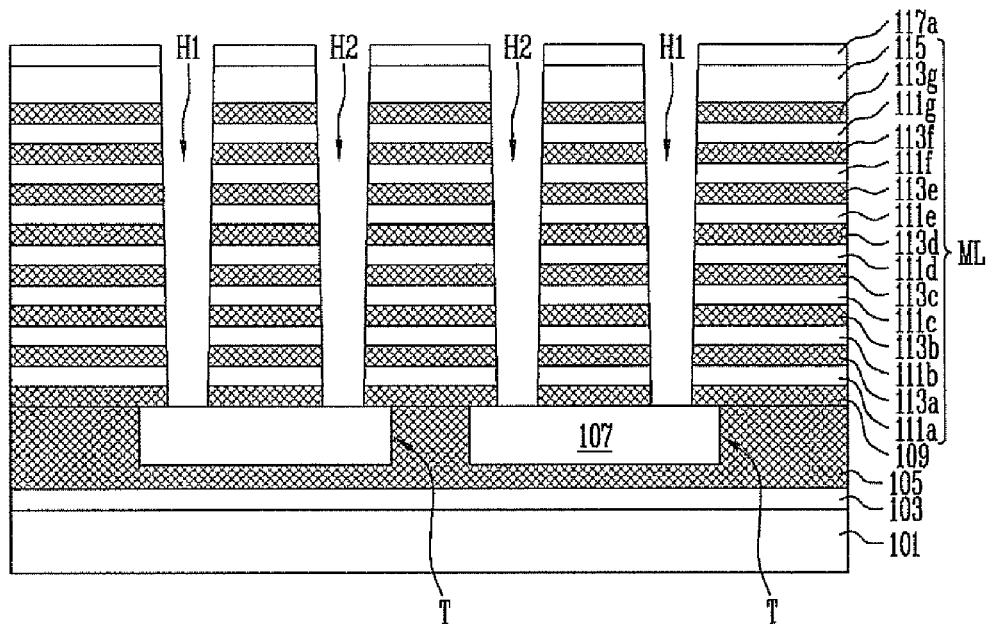

Referring to FIG. 2C, hard mask patterns 117a are formed by patterning the hard mask layer 117 using a photolithography process. Thus, part of the stack structures ML where vertical holes H1 and H2 will be formed is exposed between the hard mask patterns 117a. Part of the stack structures ML, exposed between the hard mask patterns 117a, and the second conductive layer 109 are removed by an etch process. Thus, each of the pairs of vertical holes H1 and H2 is coupled to both ends of the trench T. Both ends of the sacrificial layer 107 are exposed through each pair of vertical holes H1 and H2. One of the pair of vertical holes H1 and H2 formed at both ends of the sacrificial layer 107 is referred to as a first vertical hole H1, and the other thereof is referred to as a second vertical hole H2, for convenience of description. Here, the first vertical holes H1 through which the respective sacrificial layers 107 adjacent to each other are exposed are adjacent to each other. Furthermore, the second vertical holes H2, each exposing the respective sacrificial layers 107 adjacent to each other, are located adjacent to each other.

Figure 2D:
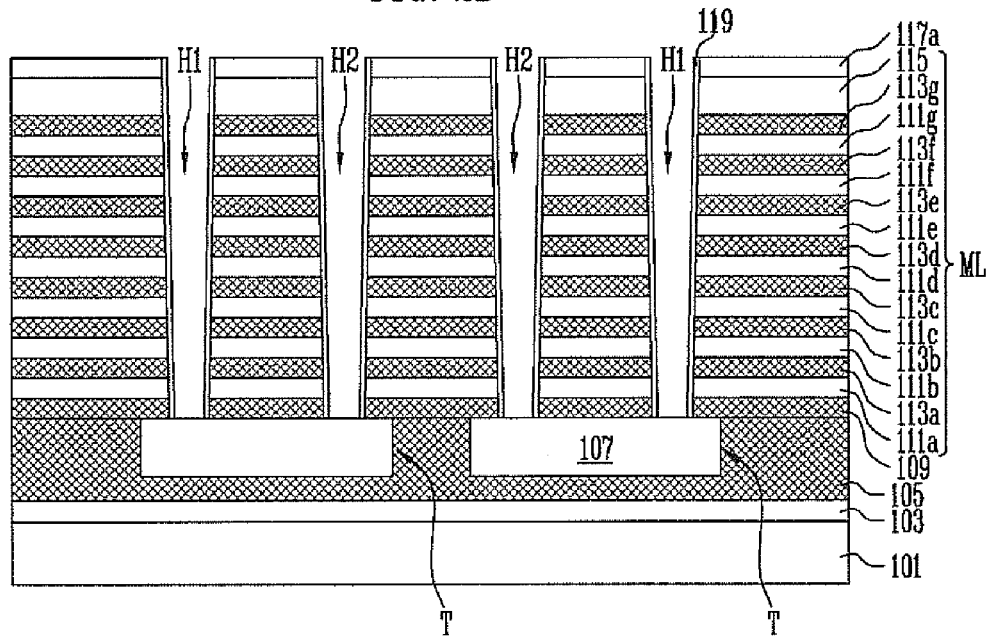

Referring to FIG. 2D, a passivation layer 119 may be formed on the sidewalls of the first and the second vertical holes H1 and H2. The passivation layer 119 preferably is made of material having a different etch selectivity against the sacrificial layer 107 and the interlayer insulating layers 111a to 111g and 115. Like the hard mask pattern 117a, the passivation layer 119 may be formed of a silicon nitride (SiN) layer. Here, the passivation layer 119 is formed to have a thinner thickness than the hard mask pattern 117a in order to prevent the hard mask patterns 117a from being fully removed in a subsequent process of removing the passivation layer 119.

Figure 2E:
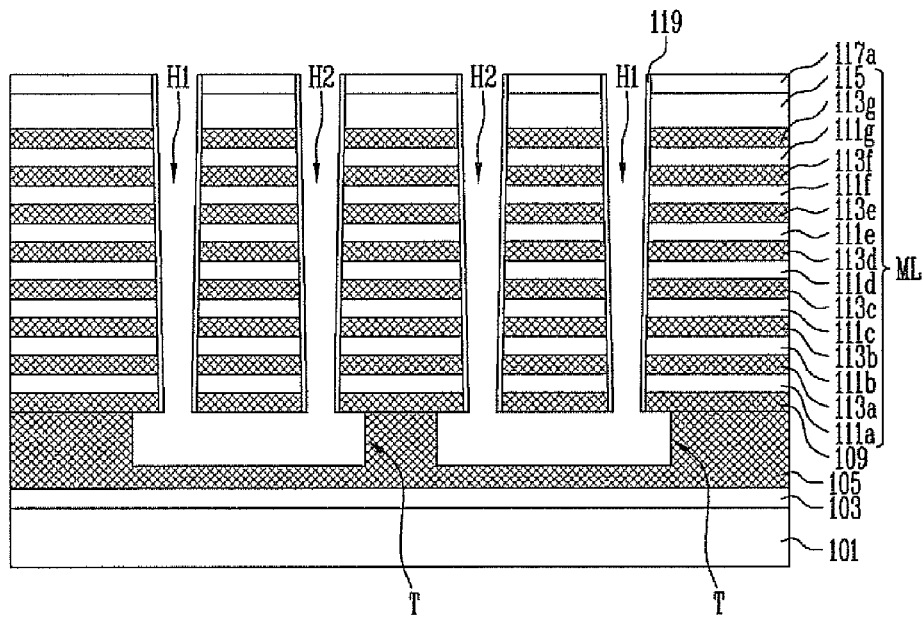

Referring to FIG. 2E, the sacrificial layer 107 is removed using an etch material that can selectively etch the sacrificial layer 107, thereby opening the trenches T. Here, although the interlayer insulating layers 111a to 111g and 115 have been made of the same material as the sacrificial layer 107, they can be protected by the passivation layer 119. The hard mask patterns 117a made of the material having a different etch selectivity against the sacrificial layer 107 may remain intact in the process of removing the sacrificial layer 107. If the sacrificial layer 107 is made of material having a different etch selectivity against the interlayer insulating layers 111a to 111g and 115, the process of forming the passivation layer 119 may be omitted.

Figure 2F:
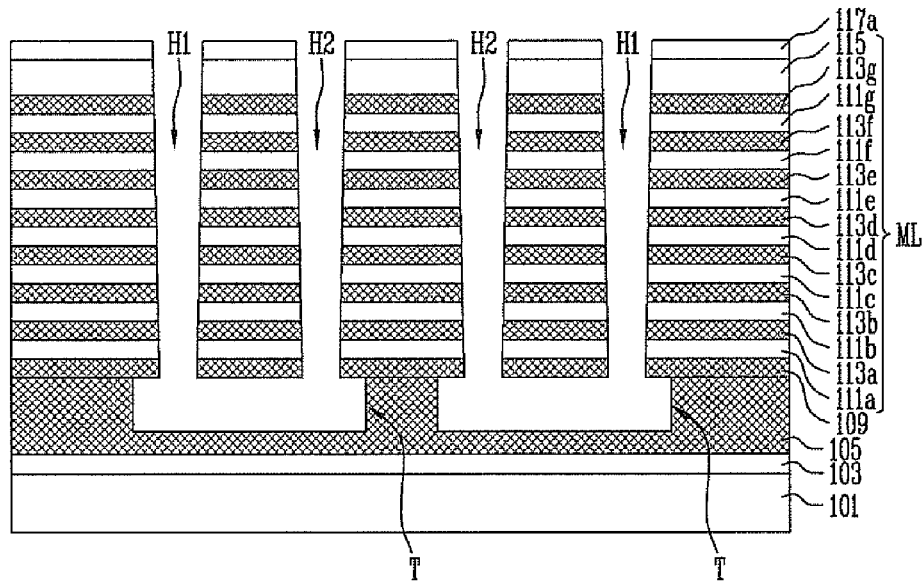

Referring to FIG. 2F, the sidewalls of the first and the second vertical holes H1 and H2 are exposed by removing the passivation layer 119 using an etch material that can selectively etch the passivation layer 119. Here, part of the hard mask patterns 117a made of the same material as the passivation layer 119 may be removed. But, the hard mask pattern 117a is not fully removed because it is formed to have a thicker thickness than the passivation layer 119.

Figure 2G:
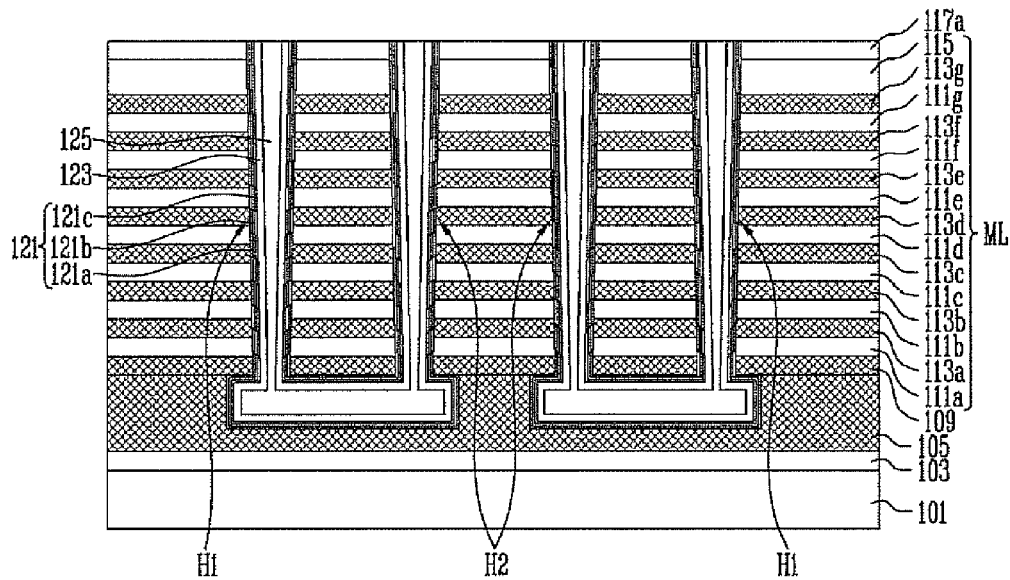

Referring to FIG. 2G, the multi-layered layer 121 is formed on a surface of the entire structure where the trenches T and the sidewalls of the first and the second vertical holes H1 and H2 are exposed. The multi-layered layer 121 may have a stack structure of a charge blocking layer 121a, a charge trap layer 121b, and a tunnel insulating layer 121c. The charge trap layer 121b may be formed of a silicon nitride (SiN) layer, a hafnium oxide ($HfO_2$) layer or a zirconium oxide ($ZrO_2$) layer, which can trap charges. Each of the charge blocking layer 121a and the tunnel insulating layer 121c may be formed of a silicon oxide ($SiO_2$) layer.

Next, a U-shaped channel layer 123 is formed on a surface of the entire structure including the multi-layered layer 121. The U-shaped channel layer 123 is a semiconductor layer and may be formed of a silicon layer. Here, the U-shaped channel layer 123 may be formed on a surface of the multi-layered layer 121, or be formed to fill the trenches T and the first and the second vertical holes H1 and H2 on which the multi-layered layer 121 has been coated.

If the U-shaped channel layer 123 is formed on a surface of the multi-layered layer 121, the trenches T on which the U-shaped channel layer 123 has been coated and the first and the second vertical holes H1 and H2 are filled with a gap-fill insulating layer 125. Preferably, the gap-fill insulating layer 125 may be made of an insulating material having high flexibility so that the first and the second vertical holes H1 and H2 and the trenches T which are narrow and long can be filled without void. For example, the gap-fill insulating layer 125 may be made of polysilazane (PSZ).

The gap-fill insulating layer 125 is polished by a polishing process until the U-shaped channel layer 123 is exposed. Next, the multi-layered layer 121 is polished by a polishing process until the hard mask patterns 117a are exposed. The polishing process may be performed using a chemical mechanical polishing (CMP) method.

Figure 2H:
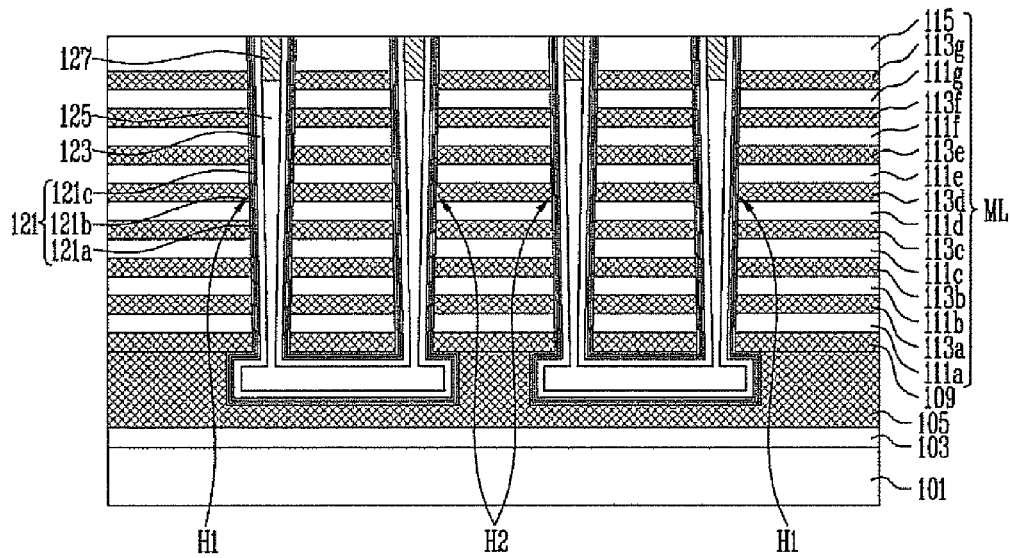

Referring to FIG. 2H, the hard mask patterns 117a may be removed. Next, the gap-fill insulating layer 125 may be removed so that the height of the gap-fill insulating layer 125 is lower than the stack structure ML. Next, regions from which the gap-fill insulating layer 125 has been removed are filled with a doped polysilicon layer 127.

The doped polysilicon layer 127 is contacted with the sidewalls of part of the U-shaped channel layers 123. The doped polysilicon layer 127 is further formed in addition to the U-shaped channel layer 123 in order to improve the channel resistance of the memory strings. Conditions, such as the type and concentration of a dopant, may be determined in various ways depending on the operating characteristics of a semiconductor device.

Figure 2I:
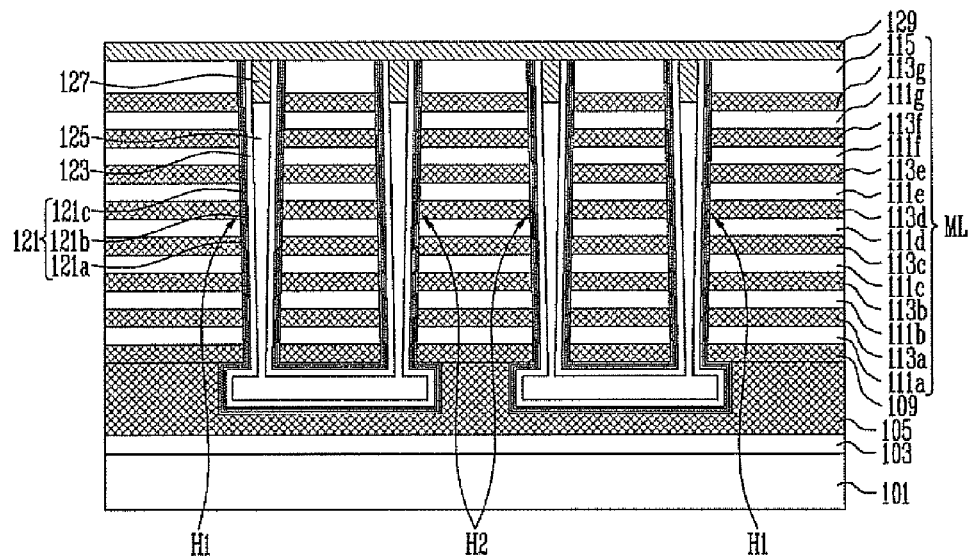

Referring to FIG. 2I, a planar channel layer 129 is formed over the entire structure in which the doped polysilicon layer 127 is formed. The planar channel layer 129 is coupled to the doped polysilicon layers 127 and the U-shaped channel layers 123. The planar channel layer 129 may be formed of a semiconductor layer. For example, the planar channel layer 129 may be formed of a doped polysilicon layer with the same dopant as, or a different dopant from, the doped polysilicon layer 127. The type and concentration of the dopant doped into the planar channel layer 129 may be determined in various ways depending on the operating characteristics of a semiconductor device.

A primary patterning process is performed on the planar channel layer 129.

Figure 3A:
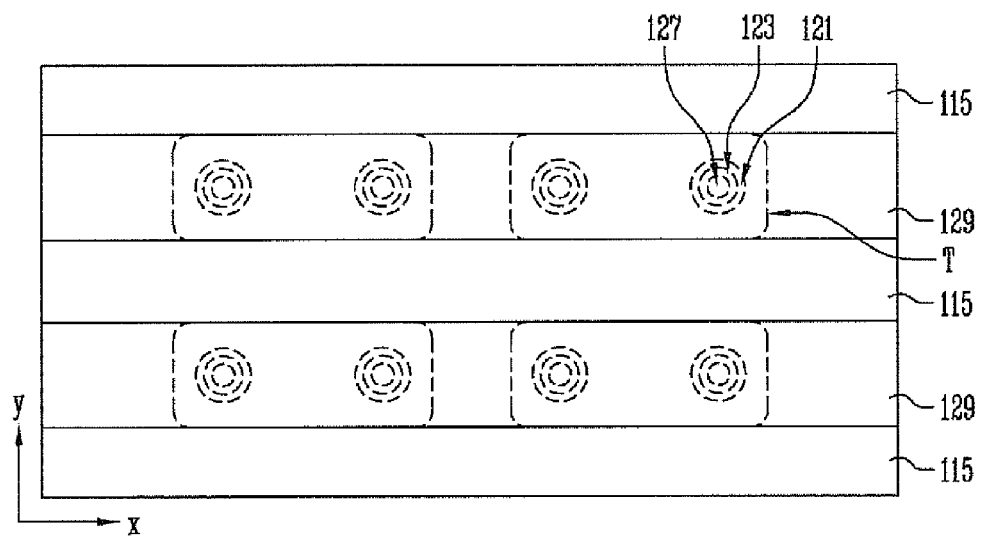
FIGS. 3A and 3B are layout diagrams showing a planar channel layer for each patterning process in order to describe a process of patterning the planar channel layer.

FIG. 3A is a layout diagram showing the primarily patterned planar channel layer 129.

Referring to FIG. 3A, the planar channel layer 129 is primarily patterned so that the interlayer insulating layer 115, i.e., the highest layer of the stack structure ML, is exposed. Thus, the primarily patterned planar channel layer 129 is extended in a direction parallel to a direction where bit lines to be subsequently formed are extended and is patterned into a plurality of line patterns. Furthermore, the multi-layered layer 121, including the charge trap layer, and the U-shaped channel layer 123 are covered by the primarily patterned planar channel layer 129.

Figure 2J:
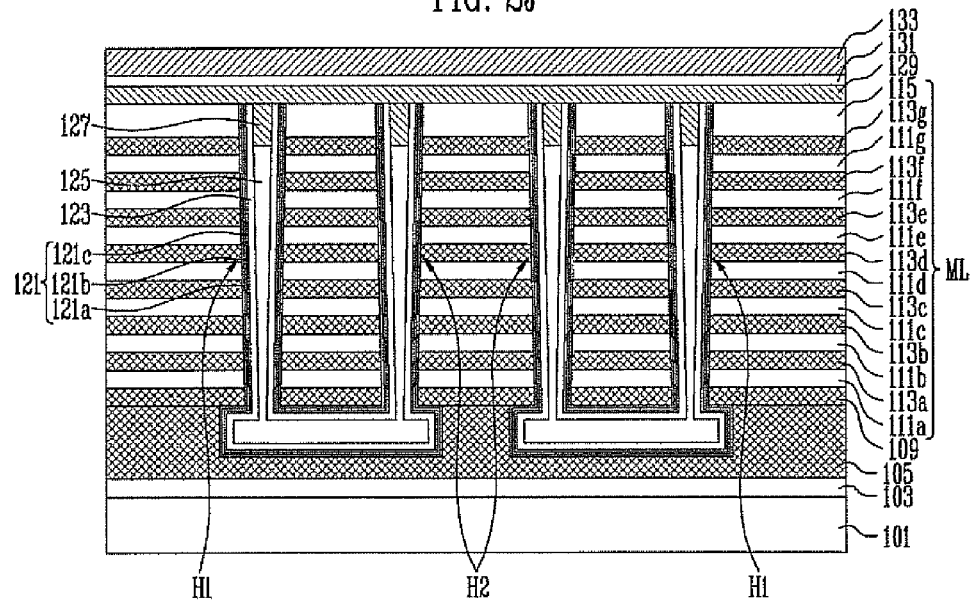

Referring to FIG. 2J, a gate insulating layer 131 and a fourth conductive layer 133, i.e., a select gate layer, are stacked over the planar channel layer 129.

The gate insulating layer 131 is the gate insulating layer of the select transistor and may be formed of a single layer of a silicon oxide ($SiO_2$) layer. The gate insulating layer 131 is separated from the charge trap layer of the multi-layered layer 121 with the planar channel layer 129 interposed therebetween and is formed separately from the multi-layered layer 121. Thus, the gate insulating layer 131 may be formed of different material from the multi-layered layer 121.

The fourth conductive layer 133 may be formed of a polysilicon layer, a metal layer, or a metal silicide layer.

Figure 2K:
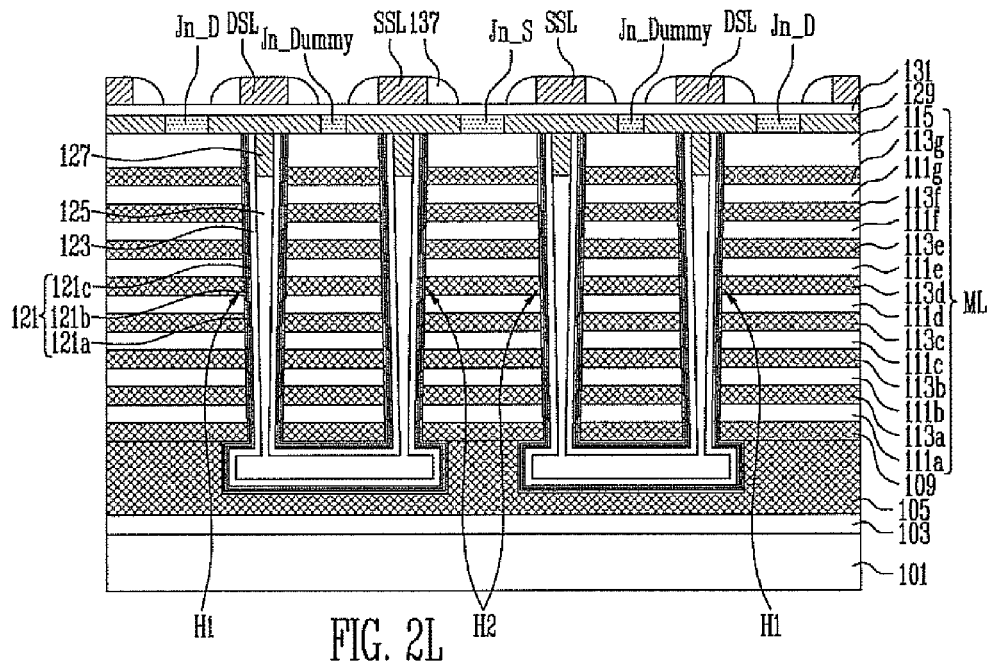

Referring to FIG. 2K, the first select lines DSL overlapped with the first vertical holes H1 and the second select lines SSL overlapped with the second vertical holes H2 are formed by patterning the fourth conductive layer 133. The first select lines DSL and the second select lines SSL are separated from each other.

Spacers 137 may be further formed on the sidewalls of the first select lines DSL and the second select lines SSL. The spacers 137 may be made of material having a different etch selectivity against the interlayer insulating layers 111a to 111g and 115 formed under the spacers 137 and an interlayer insulating layer to be formed subsequently. The spacer 137 may be formed of a nitride layer, for example.

Next, the junctions Jn_D, Jn_S, and Jn_Dummy are formed by implanting an impurity into the planar channel layer 129 opened on both sides of each of the first and the second select lines DSL and SSL. Here, the type and concentration of the impurity may be determined in various ways depending on the operating characteristics of a semiconductor device. When implanting the impurity, the first and the second select lines DSL and SSL and the spacers 137 may function as an impurity implantation mask.

The junctions include the drain junction Jn_D to be coupled to the bit line, the source junction in_S to be coupled to the source line, and the dummy region Jn_Dummy to be etched in a subsequent process.

Figure 2L:
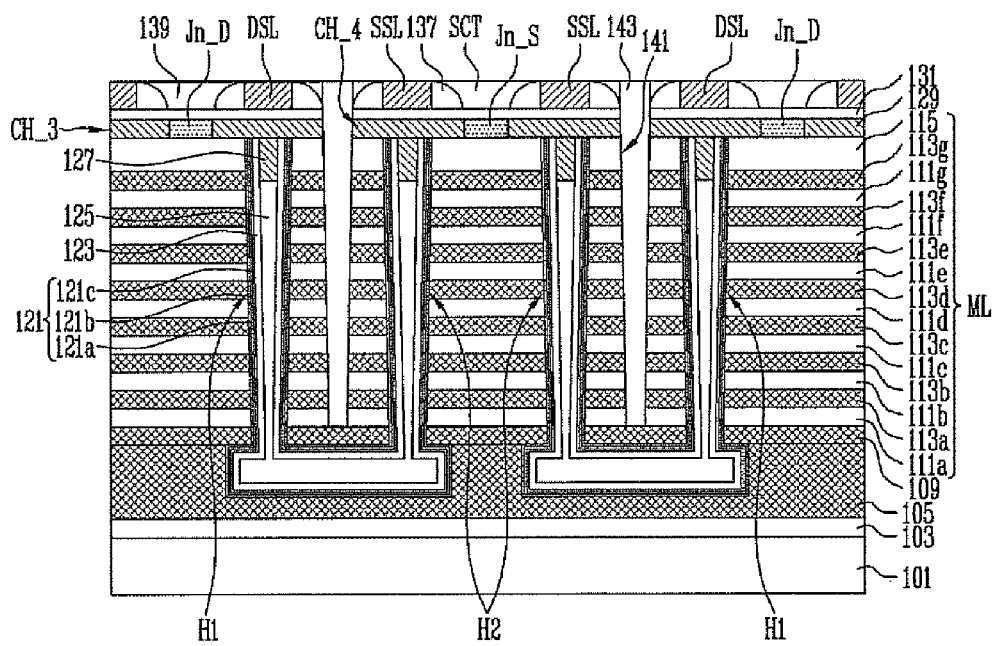

Referring to FIG. 2L, an interlayer insulating layer 139 is filled between the spacers 137. The interlayer insulating layer 139 may be formed of a silicon oxide ($SiO_2$) layer.

Next, the slit 141 is formed to penetrate the stack structure ML between the first and the second vertical holes H1 and H2 starting from the planar channel layer 129 over each of the trenches T. More particularly, each of the slits 141 is formed by etching the interlayer insulating layer 139, the gate insulating layer 131, the planar channel layer 129 between the first and the second select lines DSL and SSL, and the stack structure ML between the first and the second vertical holes H1 and H2. The slits 141 are formed to penetrate the interlayer insulating layer 139, the gate insulating layer 131, the planar channel layer 129, and the stack structure ML. The slits 141 are extended in the direction where the first and the second select lines DSL and SSL are extended. Accordingly, the third conductive layers 113a to 113g of the stack structure ML are split into the word lines WL configured to surround the first vertical holes H1 and the word lines WL configured to surround the second vertical holes H2. Furthermore, the dummy regions Jn_Dummy of the planar channel layer 129 are etched by secondarily patterning the planar channel layer 129.

Figure 3B:
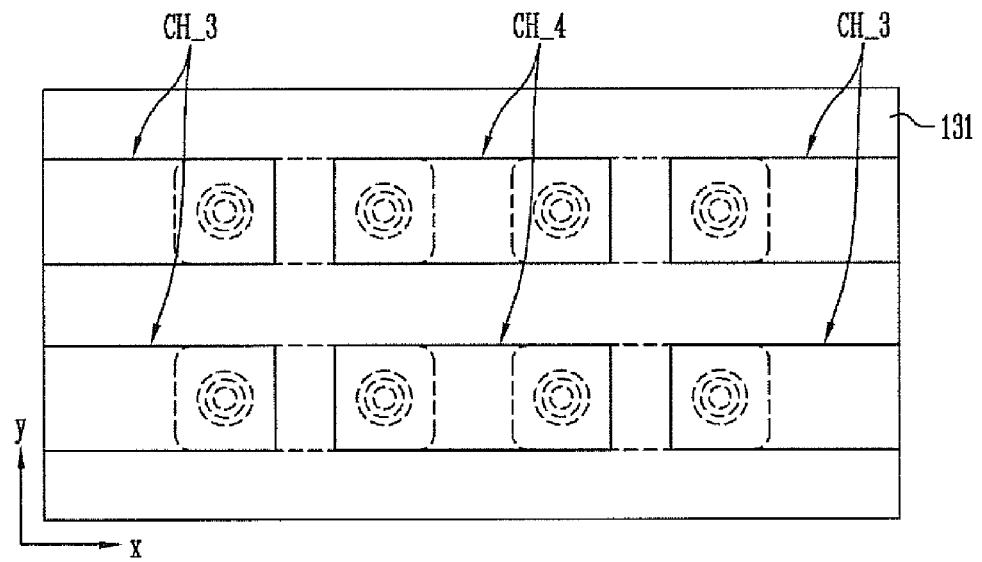

FIG. 3B is a layout diagram showing the secondarily patterned planar channel layer 129.

Referring to FIG. 3B, the planar channel layer 129 is secondarily patterned so that the dummy regions Jn_Dummy of the planar channel layer 129 are penetrated. As a result, the planar channel layer 129 is split into the first planar channel layer CH_3, including the drain junction Jn_D, and the second planar channel layer CH_4 including the source junction Jn_S.

As described above with reference to FIG. 2L, in the etch process for forming the slits 141, the spacers 137 having an etch selectivity to the interlayer insulating layer 139 can function as etch-stop layers and protect the first and the second select lines DSL and SSL. Furthermore, in the process of etching the planar channel layer 129 and the gate insulating layer 131, the U-shaped channel layer 123 and the multi-layered layer 121 including the charge trap layer are not exposed. Accordingly, a problem in that the U-shaped channel layer 123 and the multi-layered layer 121 are damaged can be improved. As a result, in accordance with the first embodiment, a problem in that the channel characteristics of the U-shaped channel layer 123 are deteriorated can be improved.

Next, the slits 141 are filled with a gap-fill insulating layer 143. The gap-fill insulating layer 143 may be made of an insulating material having high flexibility so that the narrow and long slits 141 can be filled without void. The gap-fill insulating layer 143 may be made of polysilazane (PSZ), for example.

Figure 2M:
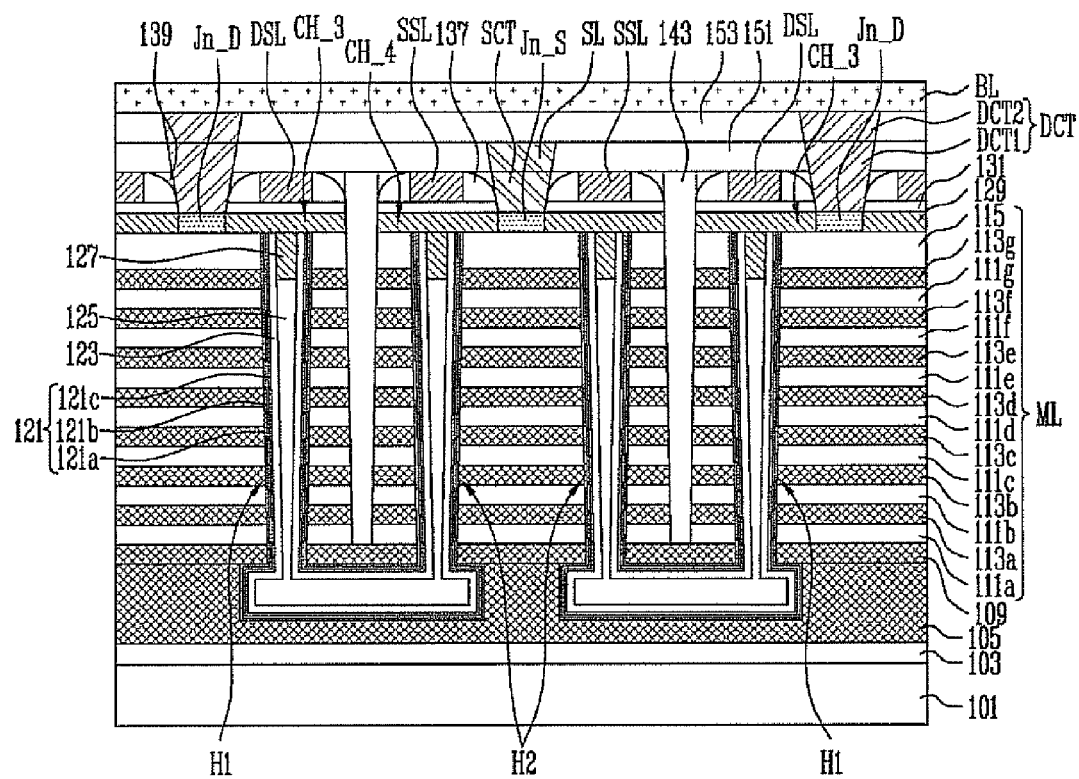

Referring to FIG. 2M, after the source junction Jn_S is exposed by etching the interlayer insulating layer 139 over the source junction Jn_S, a process of forming a source contact plug SCT by filling the region from which the interlayer insulating layer 139 has been removed with a conductive material may be further performed. Here, the spacers 137 having a different etch selectivity against the interlayer insulating layer 139 may function as etch-stop layers, thus protecting the second select lines SSL.

After an interlayer insulating layer 151 is formed over the entire structure in which the source contact plug SCT is formed, the source contact plug SCT is exposed by removing the interlayer insulating layer 151 over the source contact plug SCT using an etch process. The source line SL is formed by filling the region, generated by the removed interlayer insulating layer, with a conductive material. The interlayer insulating layer 151 may be formed of a silicon oxide ($SiO_2$) layer.

Here, the process of forming the source contact plug SCT may be omitted, and instead the source junction Jn_S and the source line SL may be formed so that they have a direct contact with each other.

After exposing the drain junctions Jn_D by removing the interlayer insulating layers 139 and 151 over the drain junctions Jn_D using an etch process, a process of forming first drain contact plugs DCT1 by filling the regions from which the interlayer insulating layers 139 and 151 have been removed with a conductive material may be further performed. Here, the spacers 137 having a different etch selectivity against the interlayer insulating layers 139 and 151 can function as etch-stop layers, thus protecting the first select lines DSL.

An interlayer insulating layer 153 is formed over the entire structure in which the first drain contact plugs DCT1 and the source contact plug SCT are formed. The interlayer insulating layer 153 may be formed of a silicon oxide ($SiO_2$) layer. After exposing the first drain contact plugs DCT1 by removing the interlayer insulating layer 153 over the first drain contact plugs DCT1 using an etch process, a process of forming second drain contact plugs DCT2 by filling the regions, generated by the removed interlayer insulating layer, with a conductive material is further performed.

Here, the first and the second drain contact plugs DCT1 and DCT2 may be formed at the same time without forming the first and the second drain contact plugs DCT1 and DCT2 separately.

Next, the bit lines BL are formed over the entire structure where the drain contact plugs DCT including the first and the second drain contact plugs DCT1 and DCT2 are formed. Accordingly, the memory strings of the 3-D structure are fabricated.

Figure 4:
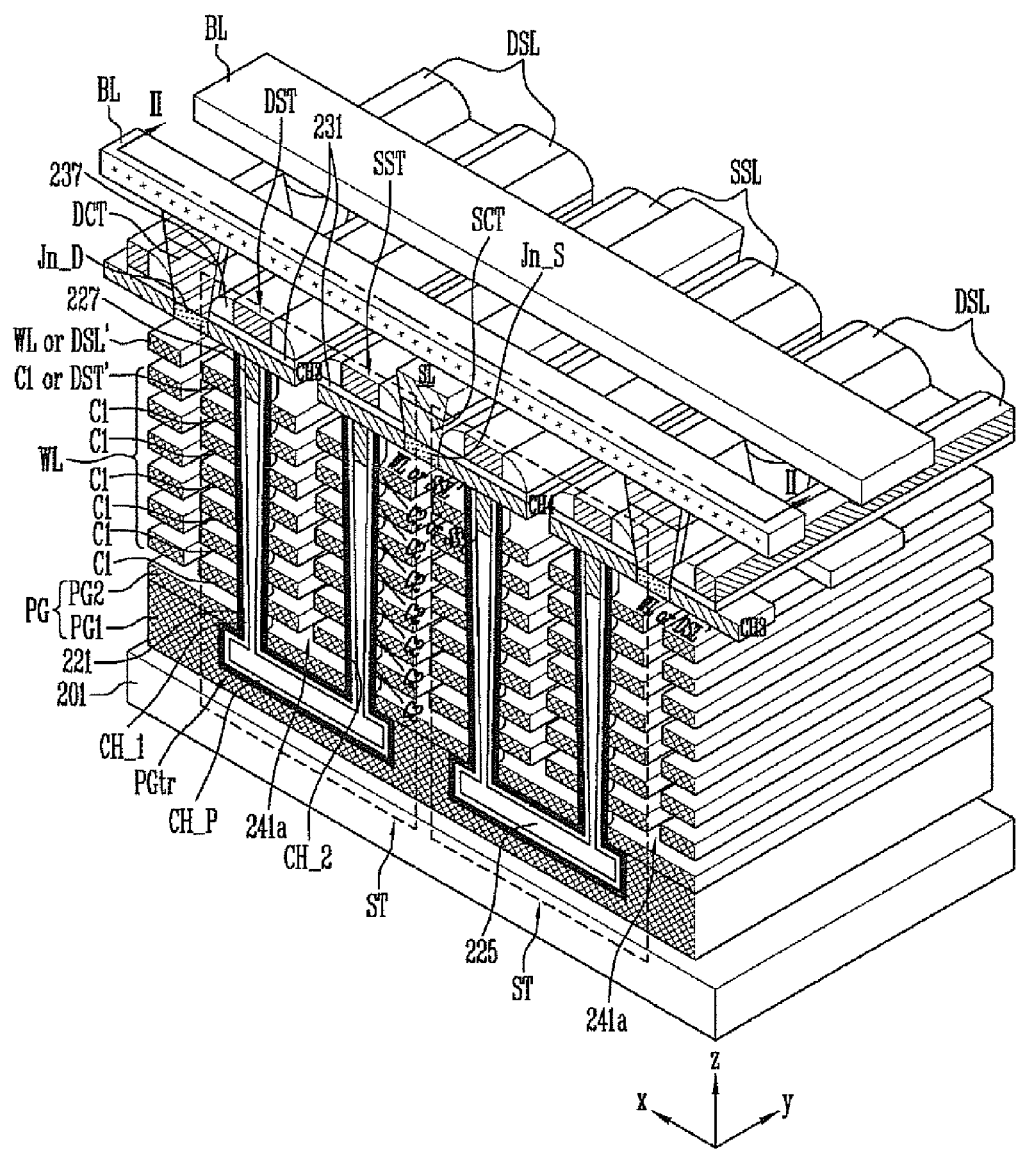
FIG. 4 is a perspective view of a 3-D nonvolatile memory device according to a second embodiment of this disclosure.

FIG. 4 is a perspective view of a 3-D nonvolatile memory device according to a second embodiment of this disclosure. In particular, the 3-D nonvolatile memory device of FIG. 4 has the same construction as the 3-D flash memory device of FIG. 1 except regions where slits are formed. Interlayer insulating layers and a gap-fill insulating layer formed within the slits are not shown in FIG. 4, for simplicity.

Like in FIG. 1, in FIG. 4, the nonvolatile memory device according to the second embodiment includes bit lines BL, a source line SL configured to cross the bit lines BL and isolated from the bit lines BL, and memory strings ST coupled between the source line SL and the bit lines BL. Unlike in the first embodiment of FIG. 1, in the second embodiment, a slit 241a is formed between the first vertical channel layers CH_1, between the second vertical channel layers CH_2 under the source and drain junctions Jn_S and Jn_D, between the first and the second planar channel layers CH_3 and CH_4, and between the first and the second vertical channel layers CH_1 and CH_2. In addition, the source line SL, the bit lines BL, and the memory strings ST formed over the substrate 201 have the same construction as those of FIG. 1.

Furthermore, like the gate insulating layers 131 of FIG. 1, gate insulating layers 231 according to the second embodiment are formed over the planar channel layers CH_3 and CH_4 of the select transistors DST and SST. Like the gap-fill insulating layer 125 of FIG. 1, a gap-fill insulating layer 225 according to the second embodiment may be filled within the channel layers CH_1, CH_2 and CH_P of the memory string ST, if the channel layers CH_1, CH_2, and CH_P of the memory string ST have an empty tube form. Like the doped silicon layer 127 of FIG. 1, a doped silicon layer 227 according to the second embodiment may be formed to fill the tops of the tube forms defined by the first and the second vertical channel layers CH_1 and CH_2 in order to improve channel resistance. Like the multi-layers 121 of FIG. 1, each of a multi-layered layer 221 according to the second embodiment may have a stack structure of a charge blocking layer, a charge trap layer, and a tunnel insulating layer. Like the spacers 137 of FIG. 1, spacers 237 according to the second embodiment are formed on the sidewalls of the select lines DSL and SSL.

In the second embodiment like the first embodiment, the gate insulating layers 231 of the first and the second select transistors DST and SST are separated from the multi-layered layer 221 including the charge trap layer. Thus, a phenomenon in which charges are trapped in the gate insulating layers 231 of the first and the second select transistors DST and SST can be improved.

Furthermore, in the second embodiment like the first embodiment, the first and the second vertical channel layers CH_1 and CH_2 are covered by the gate insulating layers 231 and the planar channel layers CH_3 and CH_4. Thus, the first and the second vertical channel layers CH_1 and CH_2 can be protected by the gate insulating layers 231 and the planar channel layers CH_3 and CH_4.

Furthermore, in the second embodiment like the first embodiment, the planar channel layers CH_3 and CH_4 of the first and the second select transistors DST and SST are formed under the gate insulating layers 231. Accordingly, damage of the gate insulating layers 231 may be reduced.

A method of manufacturing the 3-D nonvolatile memory device according to the second embodiment is described below.

Figure 5A:
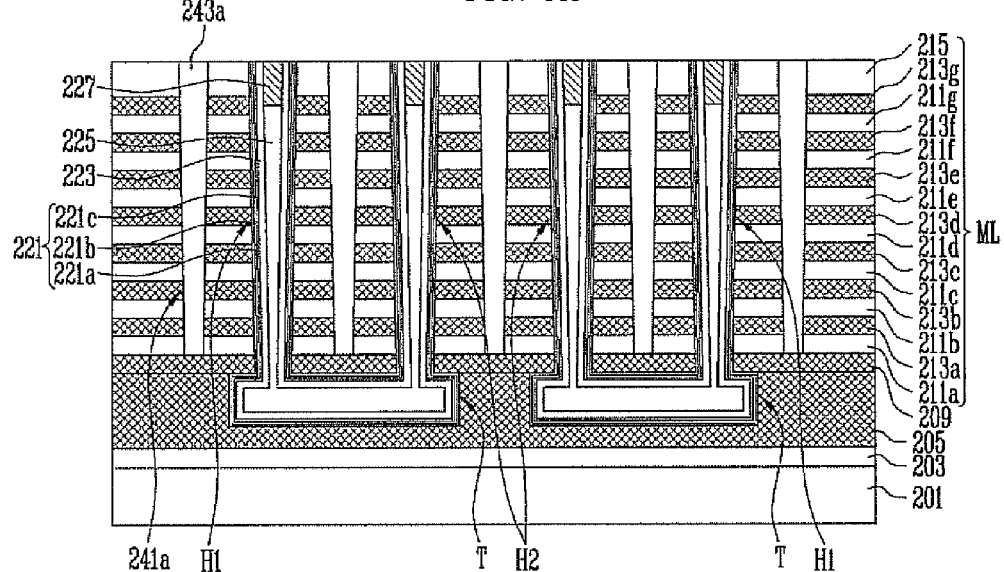
FIGS. 5A to 5C are cross-sectional views taken along line "II-II'" of the perspective view of FIG. 4 in order to describe a method of manufacturing the 3-D nonvolatile memory device.
Figure 5B:
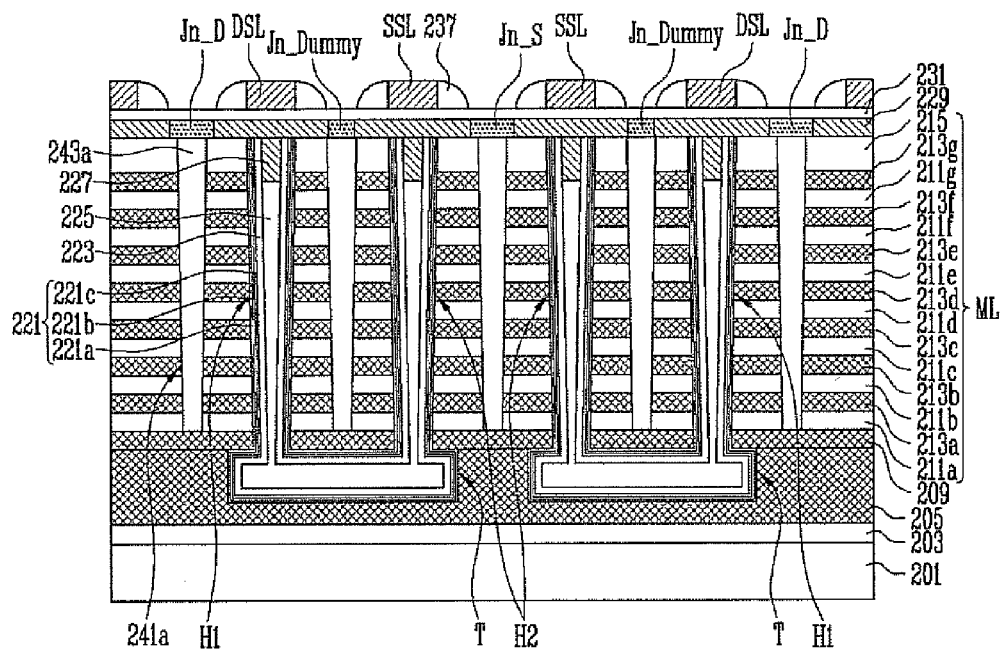
Figure 5C:
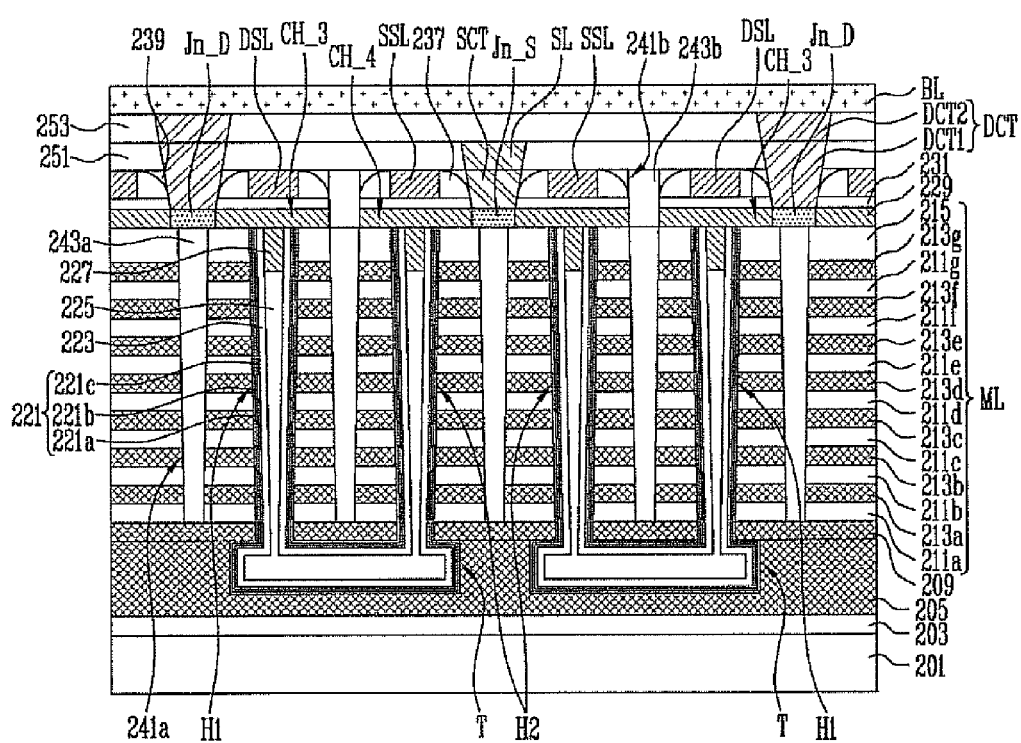

FIGS. 5A to 5C are cross-sectional views taken along line "II-II" of the perspective view of FIG. 4 in order to describe the method of manufacturing the 3-D nonvolatile memory device.

Referring to FIG. 5A, an interlayer insulating layer 203 is formed over a substrate 201. A pipe gate PG having a sacrificial layer (not shown) filled therein is formed over the interlayer insulating layer 203. The pipe gate PG includes a first conductive layer 205 functioning as a first pipe gate PG1 and a second conductive layer 209 functioning as a second pipe gate PG2. A method of forming the pipe gate PG including the interlayer insulating layer 203 and the sacrificial layer is the same as that described with reference to FIG. 2A, and thus a detailed description thereof is omitted.

Stack structures ML are formed by alternately stacking interlayer insulating layers 211a to 211a and 215 and third conductive layers 213a to 213g over the entire structure including the second conductive layer 209. A method of forming the stack structure ML is the same as that described above with reference to FIG. 2B, and thus a detailed description thereof is omitted.

First and second vertical holes H1 and H2 are formed in the stack structures ML. Trenches T are opened by removing the sacrificial layer. A method of forming the first and the second vertical holes H1 and H2 and a method of opening the trenches T are the same as those described above with reference to FIGS. 2B to 2F, and thus a detailed description thereof is omitted.

The multi-layered layer 221 is formed on a surface of the entire structure including the trenches T and the sidewalls of the first and the second vertical holes H1 and H2. The multi-layered layer 221 may have a stack structure of a charge blocking layer 221a, a charge trap layer 221b, and a tunnel insulating layer 221c. The charge trap layer 221b may be formed of a silicon nitride (SiN) layer, a hafnium oxide ($HfO_2$) layer, or a zirconium oxide ($ZrO_2$) layer which can trap charges. Each of the charge blocking layer 221a and the tunnel insulating layer 221c may be formed of a silicon oxide ($SiO_2$) layer.

Next, a U-shaped channel layer 223 is formed on a surface of the entire structure including the multi-layered layer 221. The U-shaped channel layer 223 is a semiconductor layer, e.g., a silicon layer. Here, the U-shaped channel layer 223 may be formed on a surface of the multi-layered layer 221. The U-shaped channel layer 223 may be formed to fill the trenches T and the first and the second vertical holes H1 and H2 on which the multi-layered layer 221 has been coated.

If the U-shaped channel layer 223 is formed on a surface of the multi-layered layer 221, the trenches T on which the U-shaped channel layer 223 has been coated and the first and the second vertical holes H1 and H2 are filled with a gap-fill insulating layer 225. The gap-fill insulating layer 225 be made of an insulating material having high flexibility so that the first and the second vertical holes H1 and H2 and the trenches T, which are narrow and long, can be filled without void. For example, the gap-fill insulating layer 225 may be made of polysilazane (PSZ).

Next, the gap-fill insulating layer 225 and the U-shaped channel layer 223 are polished by a polishing process. The polishing process is the same as that described above with reference to FIG. 2G. Next, like in FIG. 2H, the gap-fill insulating layer 225 is etched to decrease the height of the gap-fill insulating layer 225, which is lower than that of the stack structure ML. The regions from which the gap-fill insulating layer 225 has been removed are filled with a doped polysilicon layer 227 in order to improve the channel resistance of memory strings.

Next, first slits 241a that penetrate the stack structures ML are formed by etching the stack structure ML between the first vertical holes H1 adjacent to each other, between the second vertical holes H2 adjacent to each other, and between the first and the second vertical holes H1 and H2 adjacent to each other. The first slit 241a is formed in a line form. Thus, the third conductive layers 213a to 213g of the stack structures ML are split into word lines WL configured to surround the first vertical holes H1 and other word lines WL configured to surround the second vertical holes H2.

The first slits 241a are filled with a gap-fill insulating layer 243a. The gap-fill insulating layer 243a may be made of an insulating material having high flexibility so that the first slits 241a are filled without void. The gap-fill insulating layer 243a may be formed of polysilazane (PSZ), for example.

Referring to FIG. 5B, a planar channel layer 229 is formed over the entire structure in which the gap-fill insulating layer 243a and the doped polysilicon layer 227 are formed. The planar channel layer 229 is coupled to the doped polysilicon layers 227 and the U-shaped channel layers 223. The planar channel layer 229 may be formed of a semiconductor layer. The planar channel layer 229 may be formed of a doped polysilicon layer with the same dopant as, or a different dopant from, a dopant doped into the doped polysilicon layer 227. The type and concentration of the dopant doped into the planar channel layer 229 may be determined in various ways depending on the operating characteristics of a semiconductor device.

A primary patterning process is performed on the planar channel layer 229. Here, the planar channel layer 229 is primarily patterned so that the interlayer insulating layer 215, i.e., the highest layer of the stack structure ML, is exposed. Thus, the primarily patterned planar channel layer 229 is extended in a direction to cross the first slits 241a. The primarily patterned planar channel layer 229 is patterned into a plurality of line patterns separated from each other. Furthermore, the multi-layers 221, including the charge trap layers, and the U-shaped channel layers 223 are covered by the primarily patterned planar channel layer 229.

Next, a gate insulating layer 231 and a fourth conductive layer, i.e., a select gate layer, are stacked over the planar channel layer 229. As described above with reference to FIG. 2K, the fourth conductive layer is patterned to form the first select lines DSL, overlapped with the first vertical holes H1, and the second select lines SSL overlapped with the second vertical holes H2. The first select lines DSL and the second select lines SSL are separated from each other.

Spacers 237 may be further formed on the sidewalls of the first select lines DSL and the second select lines SSL. The spacers 237 be made of material having an etch selectivity to interlayer insulating layers to be formed subsequently. The spacer 237 may be formed of a nitride layer, for example.

Next, as described above with reference to FIG. 2K, junctions Jn_D, Jn_S, and Jn_Dummy are formed by implanting an impurity into the planar channel layer 229 opened on both sides of each of the first and the second select lines DSL and SSL.

Referring to FIG. 5C, an interlayer insulating layer 239 is filled between the spacers 237. The interlayer insulating layer 239 may be formed of a silicon oxide ($SiO_2$) layer.

Next, second slits 241b are formed over the respective regions between the trenches T. The second slits 241b are coupled to the first slits 241a through the planar channel layer 229. More particularly, the second slits 241b are formed by etching the interlayer insulating layer 239, the gate insulating layers 231, and the planar channel layers 229 between the first and the second select lines DSL and SSL. The second slits 241b are configured to penetrate the interlayer insulating layer 239, the gate insulating layers 231, and the planar channel layers 229. The second slits 241b are formed in a line form in a direction where the first slits 241a are extended. The dummy regions Jn_Dummy of the planar channel layers 229 are etched. Accordingly, the planar channel layers 229 are split into the first planar channel layer CH_3 including the drain junctions Jn_D and the second planar channel layer CH_4 including the source junction Jn_S.

In the etch process for forming the second slits 241b as described above, the spacers 237 having an etch selectivity to the interlayer insulating layer 239 may function as etch-stop layers and protect the second select lines SSL. Furthermore, in the process of etching the planar channel layers 229 and the gate insulating layer 231, the U-shaped channel layers 223 and the multi-layers 221 including the charge trap layers are not exposed. Thus, damages of the U-shaped channel layers 123 and the multi-layers 121 can be improved. As a result, in the second embodiment, a problem in that the channel characteristics of the U-shaped channel layers 223 are deteriorated can be improved.

Next, the second slit 241b are filled with a gap-fill insulating layer 243b.

Next, like in FIG. 2M, a source contact plug SCT, a source line SL, a drain contact plug DCT including first and second drain contact plugs DCT1 and DCT2, and bit lines BL are formed.

Figure 6:
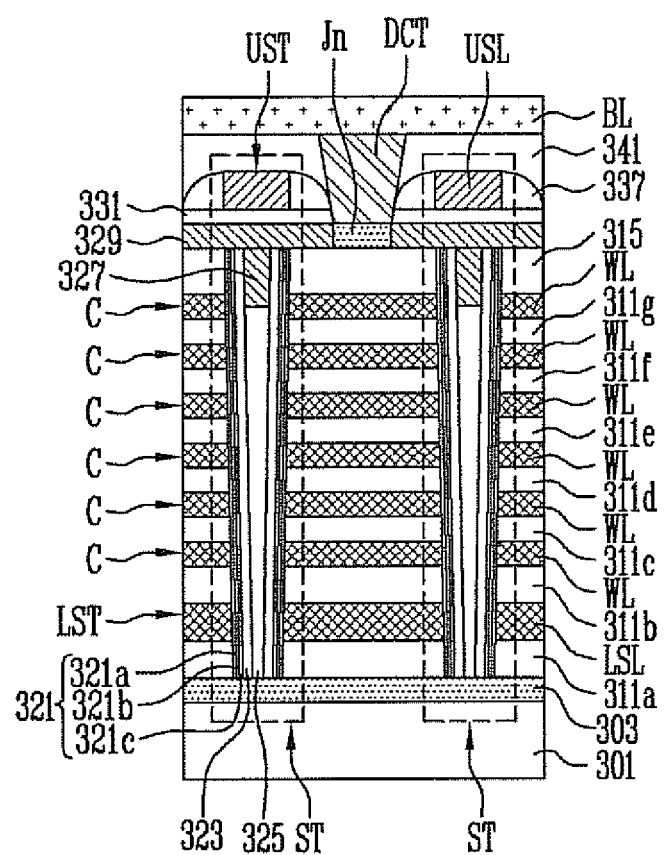
FIG. 6 is a cross-sectional view illustrating a 3-D nonvolatile memory device and a method of manufacturing the same according to a third embodiment of this disclosure.

FIG. 6 is a cross-sectional view illustrating a 3-D nonvolatile memory device and a method of manufacturing the same according to a third embodiment of this disclosure.

Referring to FIG. 6, the 3-D nonvolatile memory device according to the third embodiment includes a source region 303, a bit line BL, and a plurality of memory strings ST disposed between the source region 303 and the bit line BL.

The source region 303 is formed by implanting an impurity into a substrate 301 or a doped silicon layer formed over the substrate 301. A plurality of the memory strings ST forming a memory block may be coupled in common over the source region 303.

The bit line BL is a conductive pattern isolated from the substrate 301 and disposed over the substrate 301. The plurality of memory strings ST is coupled in parallel under the bit line BL.

Each of the memory strings ST includes memory cells C stacked along each of vertical channel layer 323 upwardly protruded from the substrate 301, a lower select transistor LST disposed between the memory cells C and the source region 303, and an upper select transistor UST disposed between the bit line BL and the memory cells C.

The lower select transistor LST includes a first select line LSL configured to surround the lower portions of the vertical channel layers 323. The first select line LSL is stacked over the substrate 301. A multi-layered layer 321 is interposed between the first select line LSL and the vertical channel layer 323. The multi-layered layer 321 is extended from the memory cells C. An interlayer insulating layer 311a is interposed between the first select line LSL and the source region 303.

The multi-layered layer 321 may have a stacked structure of a charge blocking layer 321a, a charge trap layer 321b, and a tunnel insulating layer 321c. The tunnel insulating layer 321c is formed to surround the outer wall of the vertical channel layer 323. The charge trap layer 321b is formed to surround the outer wall of the tunnel insulating layer 321c. The charge blocking layer 321a is formed to surround the outer wall of the charge trap layer 321b.

The memory cells C include interlayer insulating layers 311b to 311g, word lines WL configured to surround the vertical channel layers 323, and the multi-layers 321, each interposed between the word lines WL and the vertical channel layer 323. The interlayer insulating layers 311b to 311g and the word lines WL are alternately stacked. The word lines WL may be formed in the form of sheets separated each other for each memory block in each layer.

Each of the vertical channel layers 323 may have an empty tube form. In this case, the inside of the vertical channel layer 323 having the tube form may be filled with a gap-fill insulating layer 325. Furthermore, the upper portion of the tube form defined by the vertical channel layer 323 may be filled with a doped polysilicon layer 327 in order to improve channel resistance.

The upper select transistor UST includes a planar channel layer 329 contacted with the top of at least one vertical channel layer 323 and located in parallel to the substrate 301, a gate insulating layer 331 formed over the planar channel layer 329, and a second select line USL formed over the gate insulating layer 331. The second select lines USL of the upper select transistors UST may be extended in a direction to cross the bit line BL. Each of the planar channel layers 329 may be coupled in common to the vertical channel layers 323 arranged in a line in the direction parallel to the bit line BL. Junctions Jn with an implanted impurity are formed within the planar channel layer 329 between the second select lines USL. An interlayer insulating layer 315 is formed between the planar channel layer 329 and the word lines WL. Furthermore, spacers 337 may be further formed on the sidewalls of the second select line USL. The spacers 337 are made of material having an etch selectivity to an interlayer insulating layer 341, thus being capable of protecting the sidewalls of the second select lines USL during a process of etching the interlayer insulating layer 341.

A method of manufacturing the nonvolatile memory device described with reference to FIG. 6 is described below.

The source region 303 is formed by implanting an impurity into the substrate 301 or depositing a doped polysilicon layer on the substrate 301. An N type or P type impurity may be implanted into the source region 303. The plurality of interlayer insulating layers 311a to 311g and 315 and a plurality of conductive layers are alternately stacked over the substrate 301 including the source region 303. The plurality of conductive layers is for the first select line LSL and the word lines WL.

A plurality of vertical holes is formed by etching the plurality of interlayer insulating layers 311a to 311g and 315 and the plurality of conductive layers using an etch process. The plurality of vertical holes is configured to penetrate the plurality of interlayer insulating layers 311a to 311g and 315 and the plurality of conductive layers. Next, the multi-layered layer 321 is formed by stacking the charge blocking layer 321a, the charge trap layer 321b, and the tunnel insulating layer 321c over surfaces of the plurality of vertical holes.

The vertical channel layer 323 is formed within the vertical hole in which the multi-layered layer 321 is formed. The vertical channel layer 323 may be formed to fill the vertical hole or may be formed on a surface of the tunnel insulating layer 321c, thus having an empty tube form. If the vertical channel layer 323 has an empty tube form, the inside of the vertical channel layer 323 is filled with the gap-fill insulating layer 325. The gap-fill insulating layer 325 is etched so that the height of the gap-fill insulating layer 325 is lower than that of the vertical channel layer 323. The parts from which the gap-fill insulating layer 325 has been etched are filled with the doped polysilicon layer 327.

Next, the planar channel layer 329 is formed over the entire structure. The planar channel layer 329 is patterned. The gate insulating layer 331 and a select gate layer are stacked over the patterned planar channel layer 329. The plurality of second select lines USL is formed by etching the select gate layer. Furthermore, the spacers 337 are formed on the sidewalls of the second select lines USL. Next, the junction in is formed by implanting an impurity into the planar channel layer 329 between the second select lines USL.

Next, the interlayer insulating layer 341 is formed over the entire structure. The interlayer insulating layer 341 and the gate insulating layer 331 over the junction Jn are etched. The regions from which the interlayer insulating layer 341 and the gate insulating layer 331 have been etched are filled with a conductive material, thereby forming a contact plug DCT coupled to the junction Jn. The bit line BL is formed over the contact plug DCT.

In accordance with the third embodiment, the gate insulating layer 331 of the upper select transistor UST is separated from the multi-layered layer 321 including the charge trap layer. Thus, a phenomenon in which charges are trapped in the gate insulating layer 331 of the upper select transistor UST can be improved. As a result, in the third embodiment, although an erase operation is performed by raising a Gate Induced Drain Leakage (GIDL) current, a phenomenon in which the threshold voltages of the upper select transistors UST shift can be suppressed.

Furthermore, the vertical channel layer 323 of the memory cells C is covered by the gate insulating layer 331 of the upper select transistor UST and the planar channel layer 329. Accordingly, although the etch process for patterning the gate insulating layer 331 of the upper select transistor UST and the planar channel layer 323 is performed, a problem in that the vertical channel layer 323 of the memory cells C is damaged can be improved. As a result, in the third embodiment, the deteriorated channel characteristics of the memory cells C may be improved.

Furthermore, the planar channel layer 329 of the upper select transistor UST is formed under the gate insulating layer 331. Thus, although the planar channel layer 329 of the upper select transistor UST is patterned, a problem in that the gate insulating layer 331 is damaged can be prevented.

Figure 7:
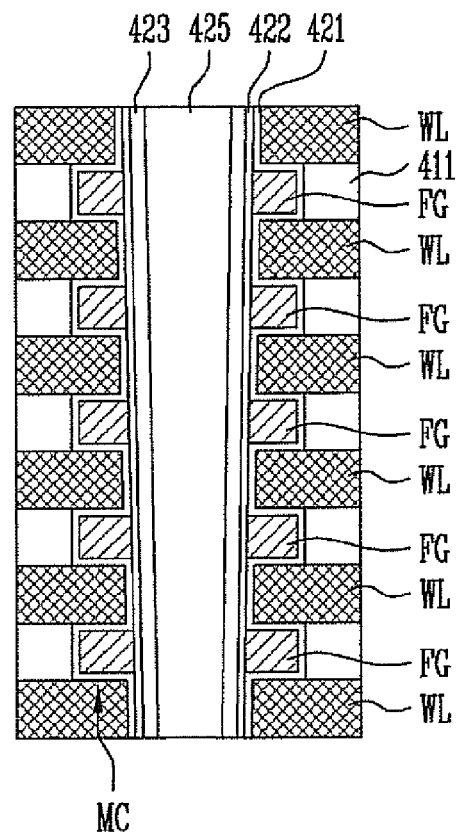
FIG. 7 is a cross-sectional view illustrating a 3-D nonvolatile memory device and a method of manufacturing the same according to a fourth embodiment of this disclosure.

FIG. 7 is a cross-sectional view illustrating a 3-D nonvolatile memory device and a method of manufacturing the same according to a fourth embodiment of this disclosure.

Referring to FIG. 7, the memory cells MC of the 3-D nonvolatile memory device according to the fourth embodiment may replace the memory cells C1, C2, and C shown in FIGS. 1, 4, and 6. The memory cells MC of FIG. 7 have a floating gate type. The memory cells MC are stacked along a vertical channel layer 423 protruded from a substrate (not shown) like the memory cells C1, C2, and C shown in FIGS. 1, 4, and 6. The vertical channel layer 423 of the fourth embodiment has an empty tube form, and the inside of the vertical channel layer 423 may be filled with a gap-fill insulating layer 425.

Furthermore, the memory cells MC of the floating gate type include a tunnel insulating layer 422 configured to surround the vertical channel layer 423, floating gates FG configured to surround the tunnel insulating layer 422, word lines WL configured to surround the vertical channel layer 423 and stacked over the substrate, and a charge blocking layer 421 interposed between the word lines WL and the floating gates FG. The word lines WL and the interlayer insulating layers 411 are alternately stacked. The floating gate FG may be formed of a polysilicon layer and may be formed between the word lines WL.

A method of forming the memory cells MC of FIG. 7 is described below.

The plurality of interlayer insulating layers 411 and a conductive layer for the plurality of word lines WL are alternately stacked over the substrate (not shown). A plurality of vertical holes is formed by etching the plurality of interlayer insulating layers 411 and the plurality of conductive layers. The plurality of vertical holes penetrates the plurality of interlayer insulating layers 411 and the plurality of conductive layers. Recess regions are formed by etching the plurality of interlayer insulating layers 411 exposed to the plurality of vertical holes. The charge blocking layer 421 is formed on a surface of the recess regions and the vertical holes. The insides of the recess regions on which the charge blocking layer 421 is coated are filled with the respective floating gates FG. An etch process is performed so that the floating gates FG remain only within the recess regions. Next, the tunnel insulating layer 422 is formed on a surface of the vertical holes in which the floating gates FG and the charge blocking layer 421 are formed. The insides of the vertical holes on which the tunnel insulating layer 422 is coated are filled with the vertical channel layer 423. Otherwise, the vertical channel layer 423 is formed on a surface of the tunnel insulating layer 422. When the vertical channel layer 423 is formed on the surface of the tunnel insulating layer 422, the vertical channel layer 423 has an empty tube form. In this case, a process of filling the inside of the vertical channel layer 423 with the gap-fill insulating layer 425 may be further performed.

Figure 8:
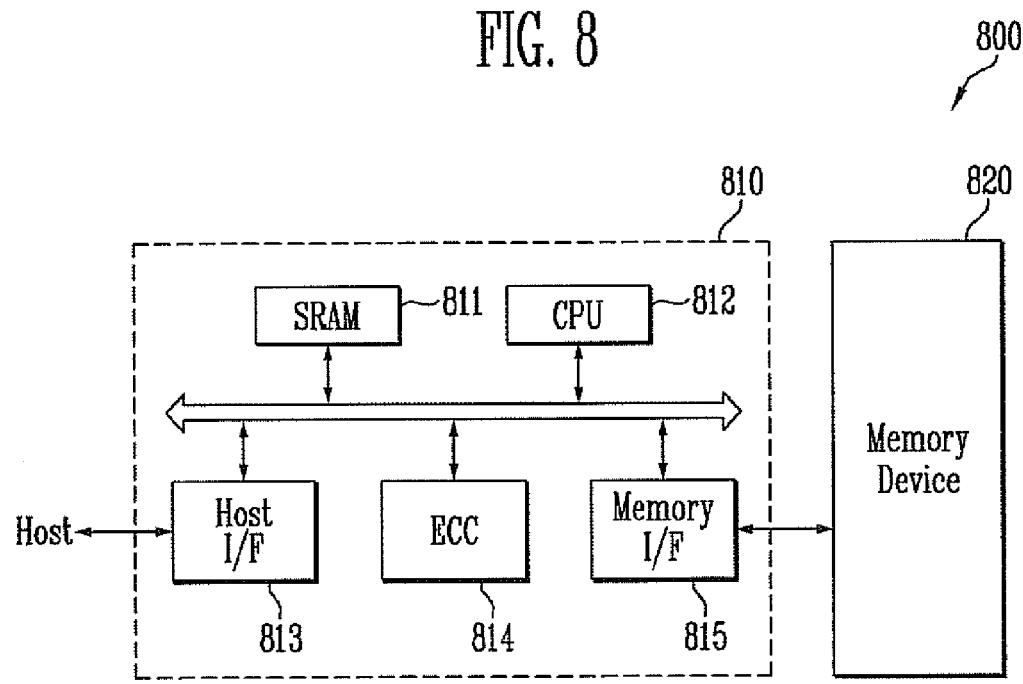
FIG. 8 is a schematic block diagram of a memory system according to an exemplary embodiment of this disclosure.

FIG. 8 is a schematic block diagram of a memory system according to an exemplary embodiment of this disclosure.

Referring to FIG. 8, the memory system 800 according to the exemplary embodiment includes a memory controller 810 and a memory device 820.

The memory device 820 includes at least one of the 3-D nonvolatile memory devices according to the first to fourth embodiments. That is, the memory device 820 includes the plurality of vertical channel layers protruded from the substrate and the plurality of memory cells stacked along the plurality of vertical channel layers. The nonvolatile memory device 820 further includes the plurality of planar channel layers, contacted with at least one of the vertical channel layers and formed in parallel to the substrate, and the plurality of select transistors configured to include the gate insulating layer formed over the plurality of planar channel layers. In some embodiments, the memory device 820 may further include other types of semiconductor memory device, such as a DRAM device and an SRAM device.

The memory controller 810 controls the exchange of data between a host Host and the memory device 820. The memory controller 810 may include a central processing unit (CPU) 812 for controlling the overall operation of the memory system 800. The memory controller 810 may include SRAM 811 used as the operating memory of the CPU 812. The memory controller 810 may further include a host interface (I/F) 813 and a memory I/F 815. The host I/F 813 may be equipped with a data exchange protocol between the memory system 800 and the host. The memory I/F 815 may couple the memory controller 810 and the memory device 820. The memory controller 810 may further include an error correction code block ECC 814. The ECC 814 can detect errors in data read from the memory device 820 and correct the detected errors. Although not shown, the memory system 800 may further include a ROM device for storing code data for interfacing with the host. The memory system 800 may be used as a portable data storage card. In some embodiments, the memory system 800 may be embodied using a solid state disk (SSD) that may replace the hard disk of a computer system.

In accordance with this disclosure, the select transistors include the planar channel layers, configured to contact with the vertical channel layers and to be parallel to the substrate, and the gate insulating layers formed over the planar channel layers, which are located over the vertical channel layers configured to become the channels of the memory cells and protruded from the substrate. Accordingly, when patterning the planar channel layers or the gate insulating layers, the vertical channel layers of the memory cells are not exposed. Thus, a concern in that the vertical channel layers are damaged when patterning the channel layers of the select transistors and the gate insulating layers can be improved. Furthermore, a concern in that the gate insulating layers are damaged when patterning the planar channel layers can be improved because the planar channel layers of the select transistors are formed under the gate insulating layers. Furthermore, the gate insulating layers of the select transistors are separated from the memory cells, and the gate insulating layers of the select transistor may be formed of different material layers from those of the charge trap layers of the memory cells. Accordingly, the amount of charges trapped in the gate insulating layers can be reduced, and thus a shift in the threshold voltages of the select transistors can be reduced.

Accordingly, reliability of the 3-D nonvolatile memory device can be improved because problems, such as a shift in the threshold voltage of the select transistor, damage to the gate insulating layer of the select transistor, and damage to the vertical channel layer of the memory cells, can be improved.

What is claimed is:

1. A three-dimensional (3-D) nonvolatile memory device, comprising:
   a plurality of vertical channel layers protruded from a substrate;
   a plurality of interlayer insulating layers and a plurality of memory cells, which are alternately stacked along the plurality of vertical channel layers; and
   a plurality of select transistors comprising a plurality of planar channel layers, each contacted with at least one of the vertical channel layers and being parallel to the substrate, and gate insulating layers formed over the plurality of planar channel layers.

2. The 3-D nonvolatile memory device of claim 1, wherein each of the select transistors further comprises a select line formed over the gate insulating layer and extended in one direction.

3. The 3-D nonvolatile memory device of claim 2, further comprising spacers formed on sidewalls of the select lines and configured to have an etch selectivity to the interlayer insulating layers.

4. The 3-D nonvolatile memory device of claim 1, further comprising a junction formed within the planar channel layer between the select transistors.

5. The 3-D nonvolatile memory device of claim 4, further comprising a source line or a bit line coupled to the junction.

6. The 3-D nonvolatile memory device of claim 1, further comprising a plurality of sub-select lines formed between the plurality of memory cells and the select transistor, configured to surround the plurality of vertical channel layers, and extended in parallel in one direction.

7. The 3-D nonvolatile memory device of claim 1, further comprising:
a pipe gate formed under the plurality of memory cells with the interlayer insulating layers interposed between the pipe gate and the memory cells; and
pipe channel layers filled within the pipe gate and each configured to couple a pair of the vertical channel layers.

8. The 3-D nonvolatile memory device of claim 7, wherein the planar channel layers are coupled to vertical channel layers adjacent to each other and coupled to the respective pipe channel layers, from among the plurality of vertical channel layers, in common.

9. The 3-D nonvolatile memory device of claim 1, wherein the memory cells comprise:
word lines configured to surround the vertical channel layer and disposed over the substrate; and
a tunnel insulating layer, a charge trap layer, and a charge blocking layer interposed between the vertical channel layer and the word lines.

10. The 3-D nonvolatile memory device of claim 1, wherein the memory cells comprises:
a tunnel insulating layer configured to surround the vertical channel layer;
a floating gate configured to surround the tunnel insulating layer;
word lines configured to surround the vertical channel layer and stacked with a floating gate interposed between the memory cells and the word lines; and
a charge blocking layer interposed between the word lines and the floating gate.

11. The 3-D nonvolatile memory device of claim 1, further comprising:
a gap-fill insulating layer filled within the vertical channel layer and configured to have a lower height than the vertical channel layer; and
a doped polysilicon layer formed over the gap-fill insulating layer, filled within the vertical channel layer, and configured to come in contact with the planar channel layer.

12. A memory system, comprising:
a three-dimensional (3-D) nonvolatile memory device configured to comprise a plurality of vertical channel layers protruded from a substrate, a plurality of interlayer insulating layers and a plurality of memory cells alternately stacked along the plurality of vertical channel layers, and a plurality of select transistors configured to comprise a plurality of planar channel layers, each contacted with at least one of the vertical channel layers and being parallel to the substrate, and gate insulating layers formed over the plurality of planar channel layers; and
a memory controller configured to control the 3-D nonvolatile memory device.

* * * * *